(12) United States Patent
Arik et al.

(10) Patent No.: US 9,572,280 B2
(45) Date of Patent: Feb. 14, 2017

(54) CHASSIS WITH DISTRIBUTED JET COOLING

(71) Applicant: General Electric Company, Schenectady, NY (US)

(72) Inventors: Mehmet Arik, Uskudar Istanbul (TR); William Dwight Gerstler, Niskayuna, NY (US); Ri Li, Niskayuna, NY (US); Earl Ross Nicewarner, Gaithersburg, MD (US); Christina Clyde Schroeder, Byron Center, MI (US); Benjamin Jon Vander Ploeg, Kentwood, MI (US); Bryan Patrick Whalen, Gansevoort, NY (US)

(73) Assignee: General Electric Company, Schenectady, NY (US)

( * ) Notice: Subject to any disclaimer, the term of this patent is extended or adjusted under 35 U.S.C. 154(b) by 111 days.

(21) Appl. No.: 14/449,452

(22) Filed: Aug. 1, 2014

(65) Prior Publication Data

US 2014/0338861 A1    Nov. 20, 2014

Related U.S. Application Data

(63) Continuation of application No. 14/327,629, filed on Jul. 10, 2014, now Pat. No. 9,474,183, which is a
(Continued)

(51) Int. Cl.
*H05K 7/20* (2006.01)
*F24F 13/02* (2006.01)

(52) U.S. Cl.
CPC .......... *H05K 7/20009* (2013.01); *F24F 13/02* (2013.01); *H05K 7/20172* (2013.01); *H05K 7/20209* (2013.01); *H01L 2924/0002* (2013.01)

(58) Field of Classification Search
CPC ............ H05K 7/20009; H05K 7/20172; H05K 7/20209; H01L 23/467; F24F 13/02
(Continued)

(56) References Cited

U.S. PATENT DOCUMENTS 5,299,090 A   3/1994  Brady et al.
5,798,465 A   8/1998  Ziada et al.
(Continued)

FOREIGN PATENT DOCUMENTS

EP   1040736 B1   2/2007
EP   1762725 A1   3/2007
(Continued)

OTHER PUBLICATIONS

Li et al., "Enhancement of Natural Convection Using Synthetic Jets," IEEE, 2010, pp. 1-8.
(Continued)

*Primary Examiner* — Tho V Duong
(74) *Attorney, Agent, or Firm* — Ziolkowski Patent Solutions Group, SC; Jean K. Testa

(57) ABSTRACT

A chassis with distributed jet cooling is provided. The chassis includes one or more sidewalls defining a volume configured to substantially surround one or more heat generating components positioned within the volume. The chassis further includes at least one array of fins thermally coupled to a respective one of the one or more sidewalls and at least one synthetic jet assembly comprising a multi-orifice synthetic jet or a number of single orifice synthetic jets disposed on a side of a respective one of the array(s) of fins. The chassis further includes at least one attachment means for attaching a respective one of the at least one synthetic jet assemblies to a respective one of the one or more sidewalls.

20 Claims, 11 Drawing Sheets

Related U.S. Application Data continuation of application No. 12/759,899, filed on Apr. 14, 2010, now Pat. No. 8,776,871.

(60) Provisional application No. 61/262,722, filed on Nov. 19, 2009.

(58) Field of Classification Search
USPC .......................................................... 165/80.3
See application file for complete search history.

(56) References Cited

U.S. PATENT DOCUMENTS

| | | | |
|---|---|---|---|
| 6,123,145 A | 9/2000 | Glezer et al. | |
| 6,232,680 B1* | 5/2001 | Bae | H01L 23/467 |
| | | | 257/E23.099 |
| 6,269,002 B1 | 7/2001 | Azar | |
| 6,588,497 B1 | 7/2003 | Glezer et al. | |
| 6,722,581 B2 | 4/2004 | Saddoughi | |
| 6,937,472 B2 | 8/2005 | Pokhama | |
| 7,023,697 B2 | 4/2006 | Pokharna et al. | |
| 7,055,329 B2 | 6/2006 | Martens et al. | |
| 7,092,254 B1* | 8/2006 | Monsef | H01L 23/473 |
| | | | 165/80.4 |
| 7,252,140 B2* | 8/2007 | Glezer | H05K 7/20172 |
| | | | 165/80.3 |
| 7,263,837 B2 | 9/2007 | Smith | |
| 7,307,841 B2 | 12/2007 | Berlin et al. | |
| 7,336,486 B2 | 2/2008 | Mongia | |
| 7,607,470 B2 | 10/2009 | Glezer et al. | |
| 7,990,705 B2 | 8/2011 | Bult et al. | |
| 8,033,324 B2 | 10/2011 | Mukasa et al. | |
| 2003/0177899 A1 | 9/2003 | Monson et al. | |
| 2004/0190305 A1 | 9/2004 | Arik et al. | |
| 2005/0121171 A1 | 6/2005 | Mukasa et al. | |
| 2006/0016581 A1* | 1/2006 | Wang | F15D 1/08 |
| | | | 165/104.33 |
| 2006/0050482 A1 | 3/2006 | Glezer et al. | |
| 2006/0196638 A1 | 9/2006 | Glezer et al. | |
| 2006/0267184 A1 | 11/2006 | Kinsman et al. | |
| 2006/0281398 A1 | 12/2006 | Yokomizo et al. | |
| 2007/0119573 A1 | 5/2007 | Mahalingam et al. | |
| 2007/0141453 A1 | 6/2007 | Mahalingam et al. | |
| 2008/0009187 A1* | 1/2008 | Grimm | H01R 13/40 |
| | | | 439/595 |
| 2008/0041574 A1 | 2/2008 | Arik et al. | |
| 2008/0043438 A1 | 2/2008 | Refai-Ahmed | |
| 2008/0137289 A1 | 6/2008 | Arik et al. | |
| 2008/0156462 A1 | 7/2008 | Arik et al. | |
| 2008/0277103 A1 | 11/2008 | Yamada et al. | |
| 2008/0295997 A1* | 12/2008 | Heffington | F15D 1/009 |
| | | | 165/84 |
| 2008/0304979 A1 | 12/2008 | Lucas | |
| 2009/0174999 A1 | 7/2009 | Sauciuc et al. | |
| 2010/0018675 A1 | 1/2010 | Aarts et al. | |
| 2010/0258270 A1 | 10/2010 | Arik et al. | |
| 2011/0024092 A1 | 2/2011 | Gerlach | |

FOREIGN PATENT DOCUMENTS

| | | | |
|---|---|---|---|
| EP | 2151863 A1 | 2/2010 | |
| JP | 0538985 U | 5/1993 | |
| JP | 05251883 A | 9/1993 | |
| JP | 2001345585 A | 12/2001 | |
| JP | 2002026214 A | 1/2002 | |
| JP | 2005011922 A | 1/2005 | |
| JP | 2005191130 A | 7/2005 | |
| JP | 2006310673 A | 11/2006 | |
| JP | 2007162525 A | 6/2007 | |
| JP | 2007192210 A | 8/2007 | |
| JP | 2008008230 | 1/2008 | |
| WO | 2008048493 A2 | 4/2008 | |

OTHER PUBLICATIONS

Messiter et al., "The Vertical Plate in Laminar Free Convection: Effects of Leading and Trailing Edges and Discontinuous Temperature," Journal of Applied Mathematics and Physics, vol. 27, 1976, pp. 633-651.

Kotapati et al., "Time-Accurate Three-Dimensional Simulations of Synthetic Jets in Quiescent Air," 43rd AIAA Aerospace Sciences Meeting and Exhibit, Reno, Nevada, Jan. 10-13, 2005, pp. 1-19.

Dittus et al., "Heat Transfer in Automobile Radiators of the Tubular Type", University of California Publications on Engineering, vol. 02, Issue No. 13, pp. 443-461, Oct. 17, 1930.

Black et al., "Heat Transfer Modules for Cooling Electronics Packages", International Symposium on Advanced Packaging Materials, pp. 209-214, Mar. 15-18, 1998.

Gilarranz et al., "Compact, High-Power Synthetic Jet Actuators for Flow Separation Control", AIAA Aerospace Sciences Meeting and Exhibit, pp. 1-15, Jan. 8-11, 2001.

Glezer et al., "Synthetic Jets", Annual Review of Fluid Mechanics, vol. 34, pp. 503-529, 2002.

Smith et al., "Jet Vectoring Using Synthetic Jets", Fluid Mechanics, vol. 458, pp. 1-34, May 2002.

Beratlis et al., "Optimization of Synthetic Jet Cooling for Microelectronics Applications", Semiconductor Thermal Measurement and Management Symposium, pp. 66-73, 2003.

Mahalingam et al., "Thermal Management Using Synthetic Jet Ejectors", IEEE Transactions on Components, Packaging and Manufacturing Technology, vol. No. 27, Issue No. 3, pp. 439-444, Sep. 2004.

Mahalingam et al., "Design and Thermal Characteristics of a Synthetic Jet Ejector Heat Sink", Electronic Packaging, vol. No. 127, Issue No. 02, pp. 172-177, Jun. 2005.

Bahadur et al., "Thermal Design and Optimization of Natural Convection Polymer Pin Fin Heat Sinks", IEEE Transactions on Components and Packaging Technologies, vol. No. 28, Issue No. 2, pp. 238-246, Jun. 2005.

Garg et al., "Meso Scale Pulsating Jets for Electronics Cooling", Electronic Packaging, vol. No. 127, Issue No. 4, pp. 503-511, Dec. 2005.

Seeley et al., "Coupled Acoustic and Heat Transfer Modeling of a Synthetic Jet", Structural Dynamics and Materials Conference, Newport, Rhode Island, May 1-4, 2006.

Pavlova et al., "Electronic Cooling Using Synthetic Jet Impingement", Heat Transfer, vol. No. 128, Issue No. 9, pp. 897-907, Sep. 20, 2006.

Arik et al., "Electronics Packaging Cooling: Technologies from Gas Turbine Engine Cooling", Electronic Packaging, vol. No. 128, Issue No. 3, pp. 215-225, Sep. 2006.

Wang et al., "Optimization of Synthetic Jet Fluidic Structures in Printed Wiring Boards", Electronic Packaging, vol. No. 128, Issue No. 4, pp. 353-359, Dec. 2006.

Uttukar et al., "Assessment of Cooling Enhancement of Synthetic Jet in Conjunction with Forced Convection", ASME International Mechanical Engineering Congress and Exposition, Seattle, WA, pp. 1-5, Nov. 11-15, 2007.

Arik et al., "Interaction of a Synthetic Jet With an Actively Cooled Heat Sink", IEEE Intersociety Conference on Thermal and Thermomechanical Phenomena in Electronic Systems, pp. 374-379, May 28-31, 2008.

European Search Report and Opinion issued in connection with corresponding EP Application No. 10158793.9 on Aug. 24, 2012.

Unofficial English Translation of Japanese Office Action issued in connection with corresponding JP Application No. 2010088256 on Feb. 4, 2014.

Unofficial English Translation of Japanese Office Action issued in connection with corresponding JP Application No. 2011084147 on Aug. 4, 2015.

Unofficial English translation of Office Action issued in connection with corresponding JP Application No. 2011-084147 on Jan. 6, 2015.

* cited by examiner

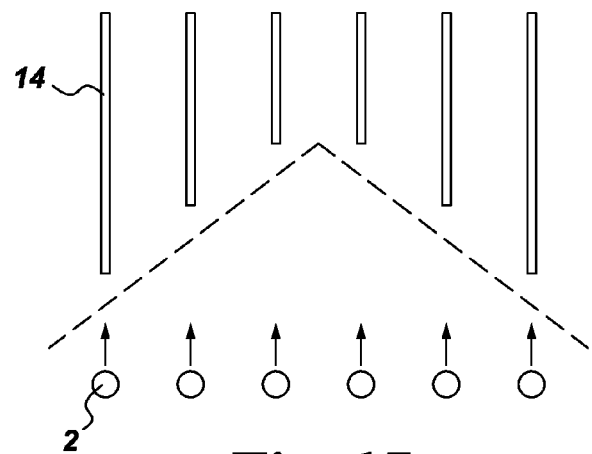
Fig. 17
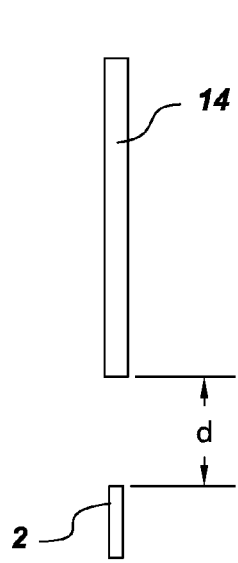
Fig. 18
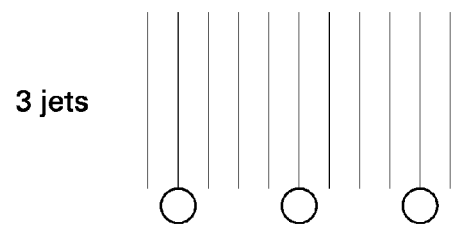
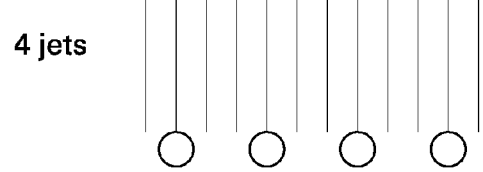
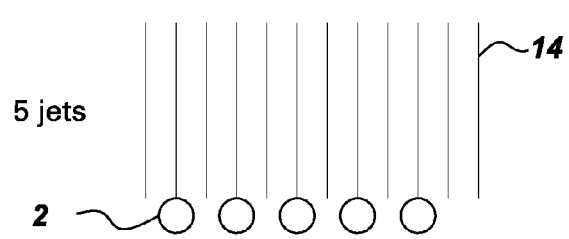
Fig. 19

A-A

CHASSIS WITH DISTRIBUTED JET COOLING

CROSS REFERENCE TO RELATED APPLICATIONS

The present application is a continuation of, and claims priority to, U.S. non-provisional application Ser. No. 14/327,629, filed Jul. 10, 2014, which is a continuation of, and claims priority to, U.S. non-provisional application Ser. No. 12/759,899, filed Apr. 14, 2010, now U.S. Pat. No. 8,776,871, which claims priority to U.S. provisional application Ser. No. 61/262,722, filed Nov. 19, 2009, the disclosures of which are incorporated herein by reference.

BACKGROUND OF THE INVENTION

The invention relates generally to thermal management systems, and more particularly, to thermal management systems with distributed jet cooling to augment convection heat transfer.

Recent advancements in electronics technology have produced nanometer sized electronic circuits. The resulting advanced electronics, although smaller, have higher heat fluxes. Because thermal real estate has been shrinking, advanced cooling techniques are needed. Cost, size, reliability, and availability have been major constraints.

Natural convection air-cooling is the method of choice for many low power electronics applications due to cost, availability, and reliability. However, its performance is limited due to buoyancy dependent flow. Therefore, there is a need for further enhancement of natural convection, in order to cool modern power electronics. Enhanced natural convection will allow higher heat dissipation and still largely maintain the simplicity of passive cooling.

Synthetic jets are small-scale turbulent jets formed from periodic suction and ejection of the ambient fluid. The jets may impinge upon a heat transfer surface enhancing convection cooling. Likewise, they may flow parallel to a heat transfer surface, also enhancing convection cooling. The small size of these devices, accompanied by a high air velocity, could enable a significant reduction in the size of thermal management hardware for power electronics. Synthetic jets are historically used for boundary layer control applications. However, they have also been shown to augment natural and forced convection heat transfer.

Although studies indicate that heat transfer augmentation is possible using synthetic jets, there is limited data available for the application of synthetic jets to large heat sink surfaces. In addition, new attachment means are needed for reliable attachment of synthetic jets to a chassis. Accordingly, it would be desirable to understand the interaction between main flow and synthetic jet flow and to exploit this interaction to achieve heat transfer enhancement for large heat sink surfaces, such as chassis cooling applications. It would further be desirable to provide reliable attachment means to attach synthetic jets to a chassis.

BRIEF DESCRIPTION

One aspect of the present invention resides in a chassis with distributed jet cooling, the chassis comprising one or more sidewalls defining a volume configured to substantially surround one or more heat generating components positioned within the volume. The chassis further includes at least one array of fins thermally coupled to a respective one of the one or more sidewalls and at least one synthetic jet assembly comprising a multi-orifice synthetic jet or a number of single orifice synthetic jets disposed on a side of a respective one of the array(s) of fins. The chassis further includes at least one attachment means for attaching a respective one of the at least one synthetic jet assemblies to a respective one of the one or more sidewalls. Another aspect of the invention resides in a chassis with distributed jet cooling, the chassis comprising one or more sidewalls defining a volume configured to substantially surround one or more heat generating components positioned within the volume and at least one array of fins thermally coupled to a respective one of the one or more sidewalls. The chassis further includes at least one synthetic jet assembly comprising a number of single orifice synthetic jets disposed on a side of a respective one of the array(s) of fins. Each of the single orifice synthetic jets is configured to direct a jet at an end of a respective one of the fins and comprises an orifice. At least a subset of the orifices have an opening length L in a range of about three (3) millimeters (mm) to about seventeen (17) mm. The distance d between a respective one of the orifices and the respective end of the fin is in a range of about one millimeter (mm) to about seven (7) mm.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 17 illustrates a v-groove plate fin configuration;

FIG. 18 illustrates the spacing d between a synthetic jet and a fin;

FIG. 19 shows three different "on fin" arrangements of synthetic jets and fins;

DETAILED DESCRIPTION

Figure 1:
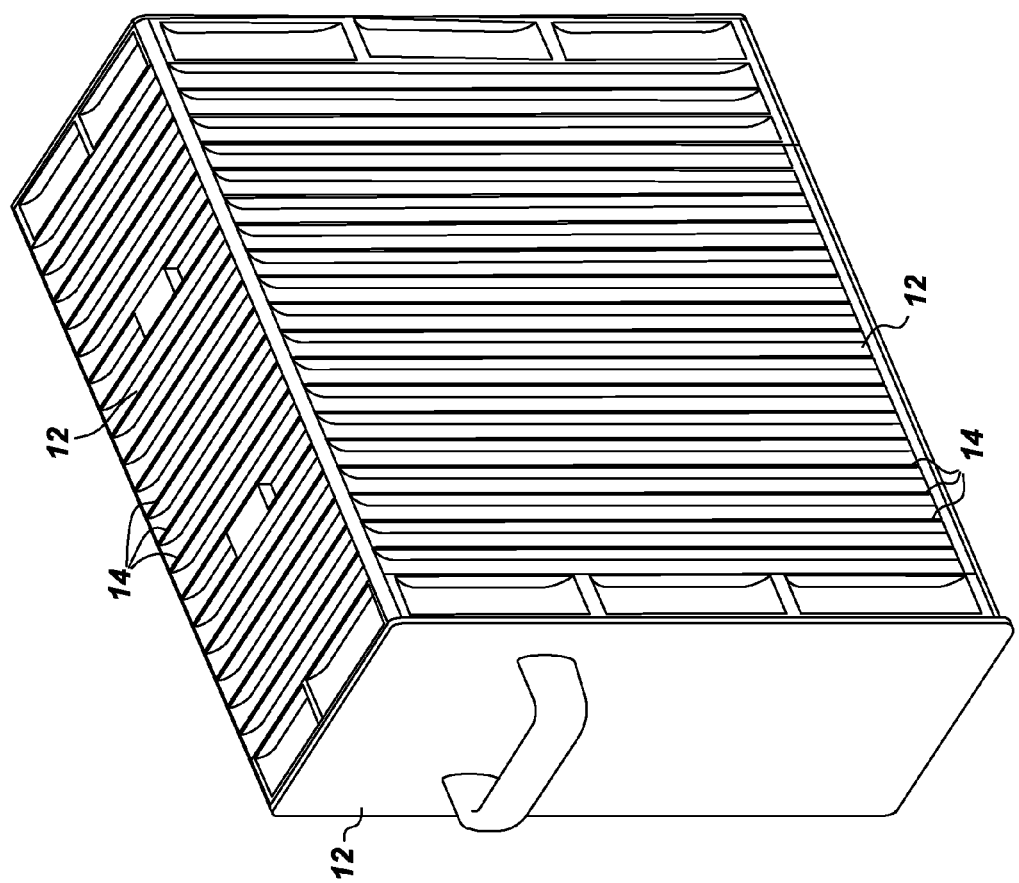
FIG. 1 shows a chassis without a synthetic jet assembly.

A chassis 10 with distributed jet cooling is described with reference to FIGS. 1-17. As shown for example in FIG. 1, the chassis 10 includes one or more sidewalls 12 defining a volume (not shown) configured to substantially surround one or more heat generating components (not shown) positioned within the volume. The heat generating components may be any component requiring cooling, non-limiting examples of which include high power processors and power electronics. The chassis further includes at least one array of fins 14 thermally coupled to a respective one of the one or more sidewalls 12. For the arrangement shown in FIG. 1, the fins 14 are longitudinal plate fins. However, other types of fins may be employed, including without limitation, pin fins. Briefly, the heat from the heat generating components is transferred into the sidewalls, which in turn transfer heat into the fins 14. The fins 14 increase the surface area for heat transfer for cooling the heat generating components.

Figure 2:
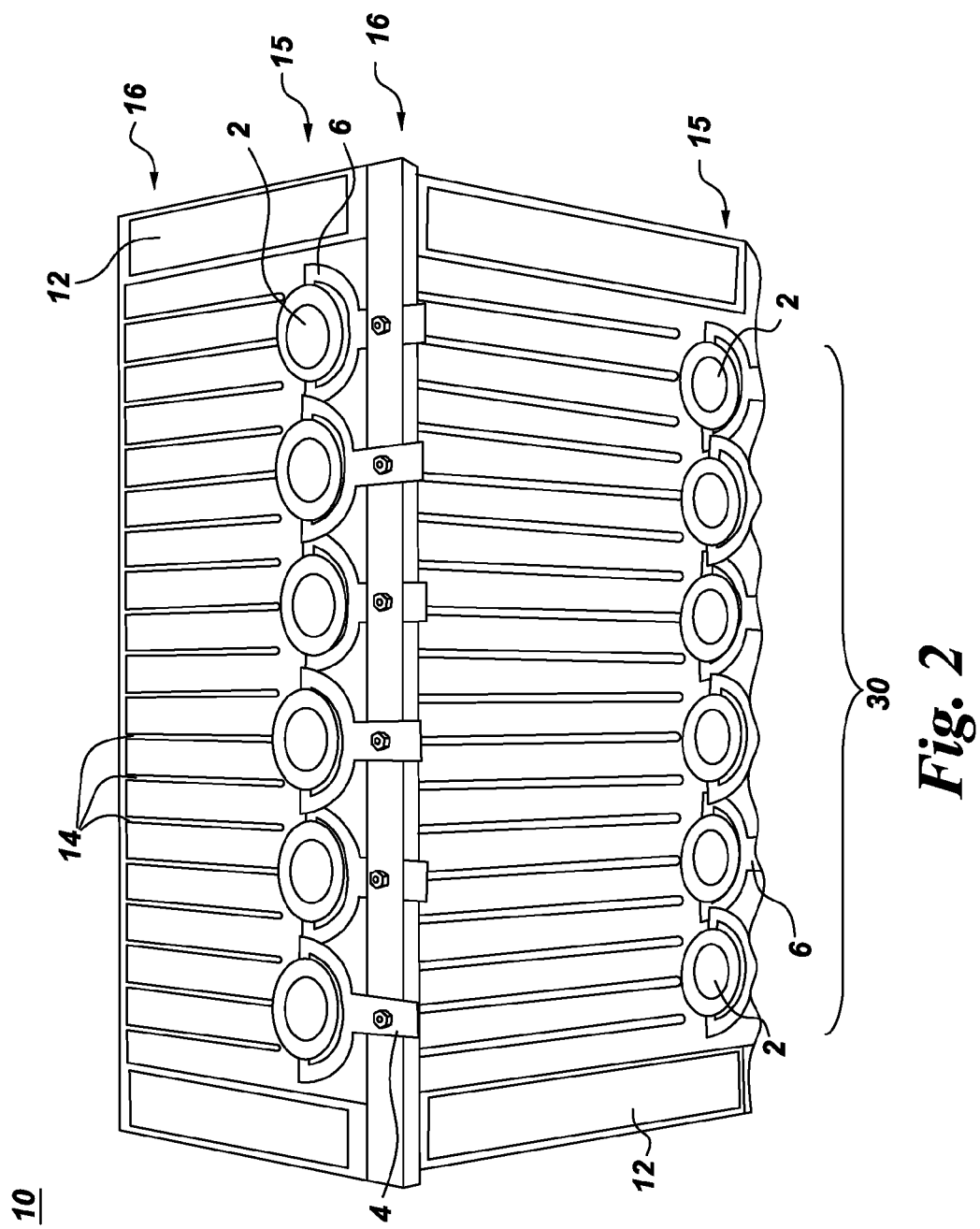
FIG. 2 shows two sidewalls of the chassis equipped with respective synthetic jets assemblies.
Figure 3:
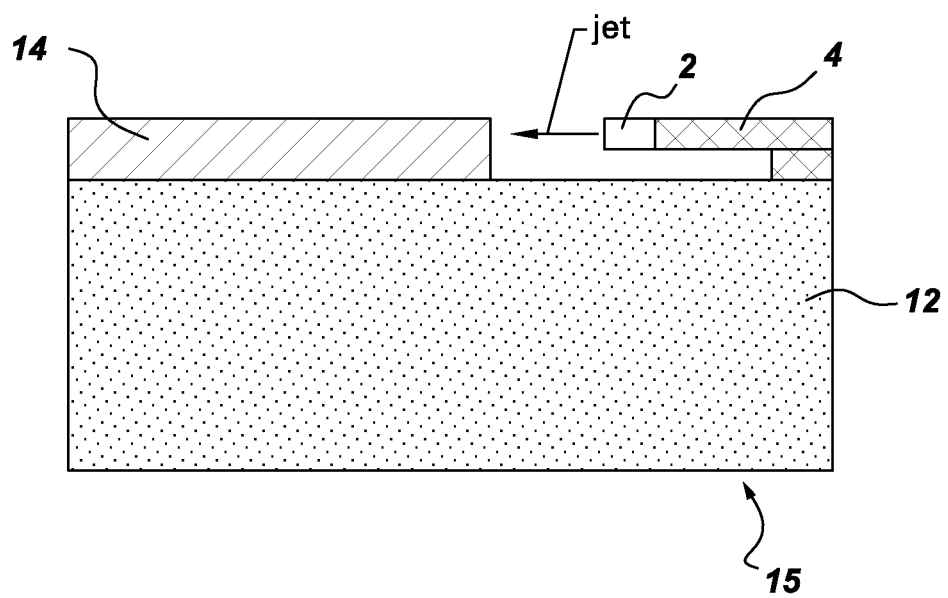
FIG. 3 illustrates a snap-in configuration for attaching the synthetic jets to the chassis sidewalls.

As shown in FIG. 2, for example, the chassis 10 further includes at least one synthetic jet assembly 30 comprising a multi-orifice synthetic jet (not shown in FIG. 2) or a number of single orifice synthetic jets 2 disposed on a side 15, 16 of a respective one of the at least one array of fins. For the example arrangement shown in FIG. 2, the synthetic jet assemblies 30 are disposed on the lower sides 15 of the respective arrays of plate fins 14. This example is illustrative, and the invention is not limited to this example configuration. In addition and as shown in FIG. 2, the chassis further includes at least one attachment means 4 for attaching a respective one of the at least one synthetic jet assemblies 30 (including the respective individual synthetic jets 2) to a respective one of the one or more sidewalls 12. The example attachment means 4 shown in FIG. 2 are merely illustrative, and a number of additional attachment arrangements are described below with reference to FIGS. 3-13. It should be noted that the invention is not limited to a specific attachment means.

Figure 15:
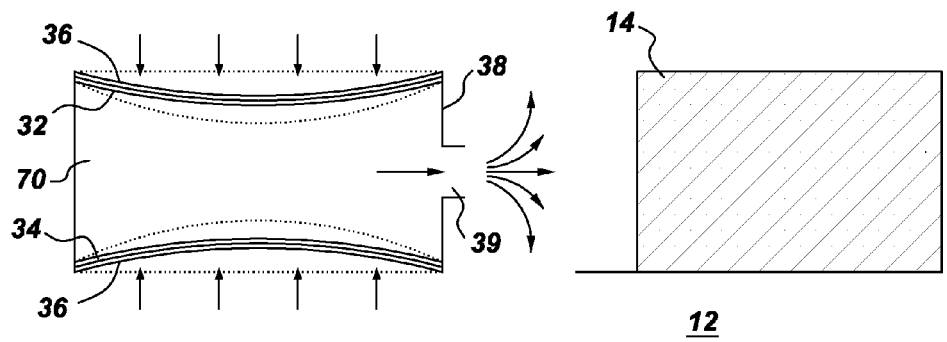
FIG. 15 illustrates the operation of a single-orifice synthetic jet.
Figure 16:
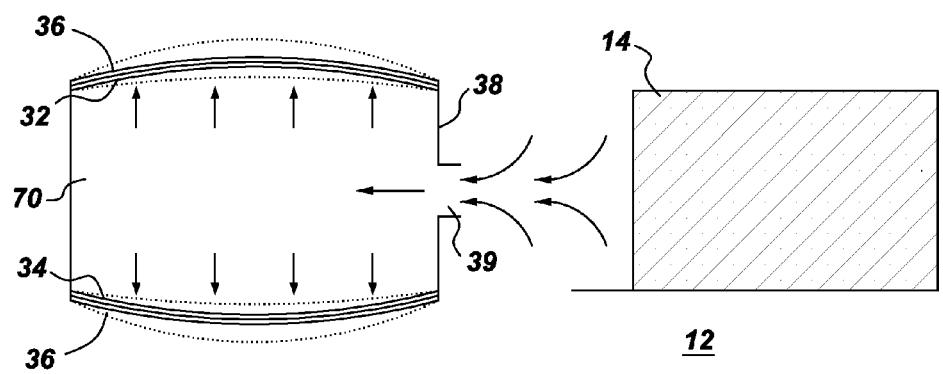
FIG. 16 further illustrates the operation of a single-orifice synthetic jet.

The operation of synthetic jets 2 can be understood with reference to FIGS. 15 and 16. As shown for example, in FIGS. 15 and 16, each of the synthetic jets 2 comprises a first flexible structure 32, a second flexible structure 34, at least one active material 36 coupled to at least one of the first and second flexible structures, and a compliant wall 38 positioned between the first and second flexible structures and defining a chamber. As indicated in FIGS. 15 and 16, the compliant wall 38 defines an orifice 39 for facilitating fluid communication between the chamber and an ambient environment of the fins 14.

In the illustrated arrangement of FIGS. 15 and 16, the active material 36 is positioned on the first flexible structure 32 and on the lower side of the second flexible structure 34. It should be noted that the locations of the active materials 36 on the flexible structures 32, 34 shown in the figures are purely illustrative, and the invention is not limited to any specific locations of active materials. Although for the arrangements shown in FIGS. 15 and 16, the active material is coextensive with the respective flexible structure, in other embodiments, the active material extends over only a portion of the flexible structure. For example, smaller diameter piezoelectric ceramic plates (not shown) may be disposed on flexible structures 32, 34 instead of coextensive active layers 36. The active material can take the form of a single continuous portion. Alternatively, multiple discontinuous portions of the active material can be employed to actuate respective ones of the flexible structures. A suitable active material is one, which is capable of creating stress resulting from an electrical stimulus. The flexible structures 32, 34 may comprise the same or different materials.

Examples of suitable active material include piezoelectric material, magnetostrictive material (magnetic fields from coils attract/oppose one another), shape-memory alloy, and motor imbalance (motor with a mass imbalance creates oscillatory motion). Within the subset of piezoelectric materials, suitable active materials include bimorph piezoelectric configurations, where two piezo layers are energized out of phase to produce bending; thunder configurations, where one piezo layer is disposed on a pre-stressed stainless steel shim; buzzer element configurations, where one piezo layer is disposed on a brass shim; and MFC configurations, where a piezo fiber composite on a flexible circuit is bonded to a shim. The active material may incorporate a ceramic material.

As schematically depicted in FIG. 2, a synthetic jet driver 40 is provided to apply an electrical current to the at least one active material 36, to form streams of ambient air. The synthetic jet driver 40 can be electrically coupled to the active material 36 using wires or flexible interconnects, for example. Briefly, electrical current from synthetic jet driver 40 is received by the active material, and transformed into mechanical energy. As shown, for example in FIG. 15, the active material 36 creates stress on the flexible walls 32, 34, causing them to flex inwardly, resulting in a chamber volume change and an influx of ambient air into the chamber 70, and then outwardly, thereby ejecting the ambient air from the chambers 70 via the orifice 39. Similarly, as illustrated in FIG. 16, when the active material 36 creates stress on the flexible chamber walls 32, 34 causing them to expand, resulting in another chamber volume change, ambient air is drawn into the chamber 70 via the orifice 39. In this manner, the driver 40 actuates the jets 30.

The synthetic jet driver 40 may be located within the chassis 10 or may be remotely located. In addition, the synthetic jet driver 40 may also be miniaturized and integrated with the synthetic jet. The current may be provided as a sine wave, a square wave, a triangular wave, or any other suitable waveform, and it should be appreciated that the current is not to be limited to any specific waveform. However, it has been found that currents having lower harmonics, such as, for example, a sine wave, may be used to provide a quieter synthetic jet 30. The voltage level for the electrical current may be between 1 and 150 volts but is not so limited. The frequency of the current may be between 2 and 300 hertz for embodiments requiring reduced noise, and between 300 hertz and 15 kilohertz for embodiments that do not require reduced noise levels.

Figure 4:
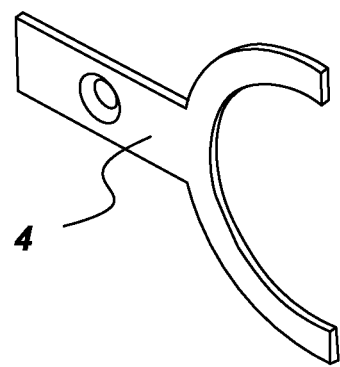
FIG. 4 shows a c-clip holder, in perspective view.
Figure 5:
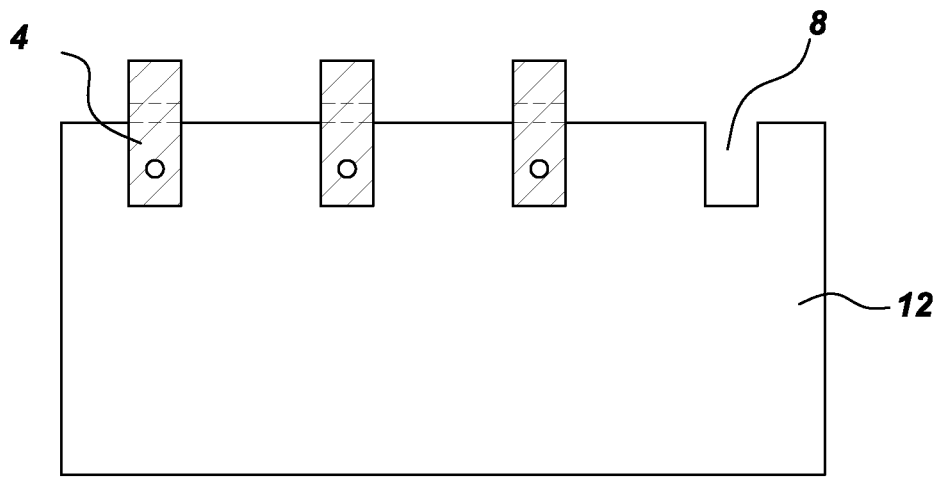
FIG. 5 is a cross-sectional view of the arrangement shown in FIG. 3 and shows a row of slots formed in a sidewall for receiving e- or c-clip holders for the synthetic jets.

For many of the illustrated configurations, each of the synthetic jet assemblies 30 comprises a number of single orifice synthetic jets 2. For the particular attachment configuration shown in FIGS. 3 and 5, at least one of the sidewalls 12 includes a number of slots 8 disposed on at least one of the sides 15, 16 of the array of fins 14, and the attachment means 4 are configured for insertion into respective ones of the slots 8 and for securing each of the respective single orifice synthetic jets 2 to the respective slots 8. For the example arrangement shown in FIG. 5, one of the slots 8 is empty for illustrative purposes. The arrangement of FIGS. 3 and 5 may be implemented using c-clip attachment means. FIG. 4 shows an example c-clip 4 in perspective view. As indicated, for example, in FIG. 2, the synthetic jets 2 may be attached to the c-clip holders 4 by means of flexible connectors 6. In one non-limiting example, the flexible connectors 6 comprise silicone "ears." As indicated for example in FIG. 5, the base of the c-clip 4 is snapped into the slot 8 to securely mount the synthetic jet 2 to the chassis sidewall 12. To further secure the synthetic jets to the chassis, the c-clip holders 4 may be bolted to the sidewall, as indicated in FIG. 5 for example.

Figure 6:
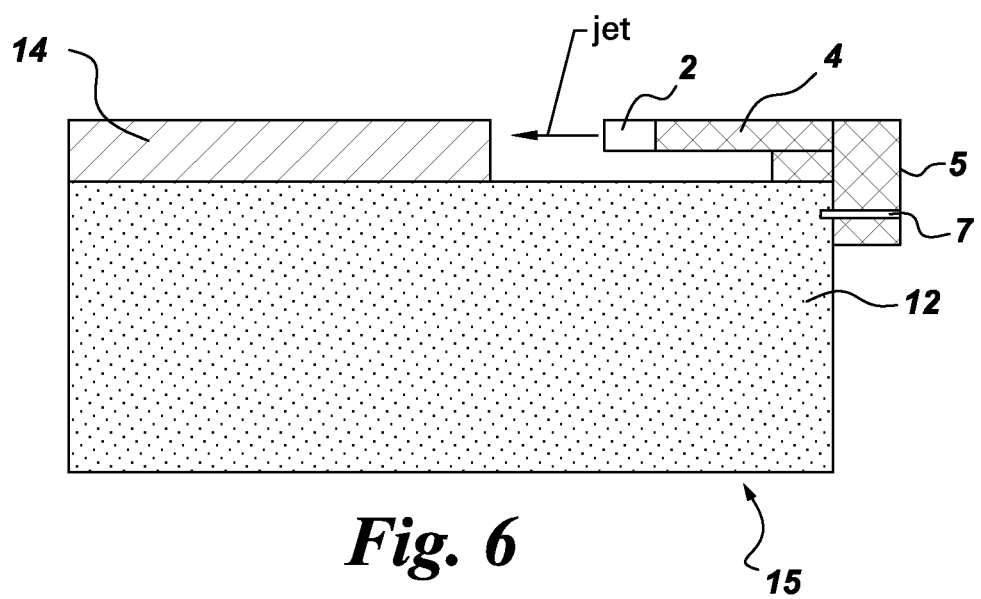
FIG. 6 illustrates a bent e-clip arrangement for attaching the synthetic jets to the chassis.

FIG. 6 illustrates another example arrangement for attaching the synthetic jets to the chassis. For the example arrangement of FIG. 6, each of the synthetic jet assemblies comprises a number of single orifice synthetic jets 2. However, for ease of illustration, only one jet 2 is shown in FIG. 2. In addition to the c-clip configuration discussed above with reference to FIGS. 3-5, e-clips may also be used to fasten respective ones of the single orifice synthetic jets 2 to the sidewalls 12. For the configuration shown in FIG. 6, the attachment means comprises a number of e-clips (also indicated by reference numeral 4). As indicated in FIG. 6, each of the e-clips 4 has a bent portion 5. As shown, each of the single orifice synthetic jets 2 is attached to a respective one of the e-clips 4, and the bent portion 5 of each of the e-clips 4 is fastened to a respective one of the sidewalls 12. For the example arrangement illustrated in FIG. 6, the bent portion 5 of each of the e-clips is fastened to the sidewall 12 using a bolt 7. The cross-sectional view for the arrangement of FIG. 6 is similar to that shown in FIG. 5 with the exception that no slots are needed for the arrangement of FIG. 6.

Figure 7:
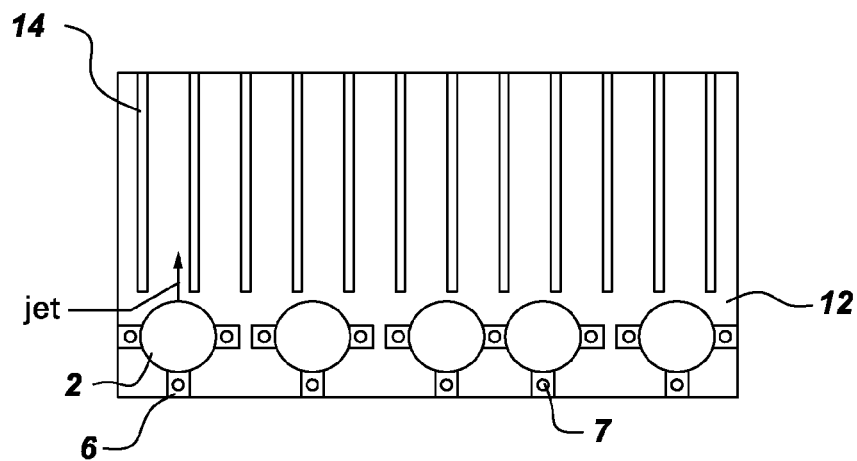
FIG. 7 illustrates another example arrangement for attaching the synthetic jets to the chassis.

FIG. 7 illustrates yet another example arrangement for attaching the synthetic jets to the chassis. For the arrangement shown in FIG. 7, each of the synthetic jet assemblies comprises a number of single orifice synthetic jets 2, and the attachment means comprise a number of flexible portions 6. As indicated in FIG. 7, each of the single orifice synthetic jets 2 has at least one flexible portion 6 affixed thereto, and each of the flexible portions 6 is fastened to a respective one of the sidewalls 12. For the example arrangement illustrated in FIG. 7, each of the synthetic jets is attached to the sidewall by means of three flexible portions 6. However, for other arrangements, other numbers of flexible portions 6 may be employed. In one non-limiting example, the flexible portions 6 comprise silicone "ears." The ears may be attached to the respective sidewall with a rod or bolt 7, for example. As indicated in FIG. 7, there may be a gap or no gap between neighboring pairs of the "ears." According to a more particular example, at least one of the single orifice synthetic jets 2 is oriented at an angle relative to the fins 14. This may be accomplished, for example, by adjusting the height of the bolt used to affix the flexible portion to the sidewall.

Figure 8:
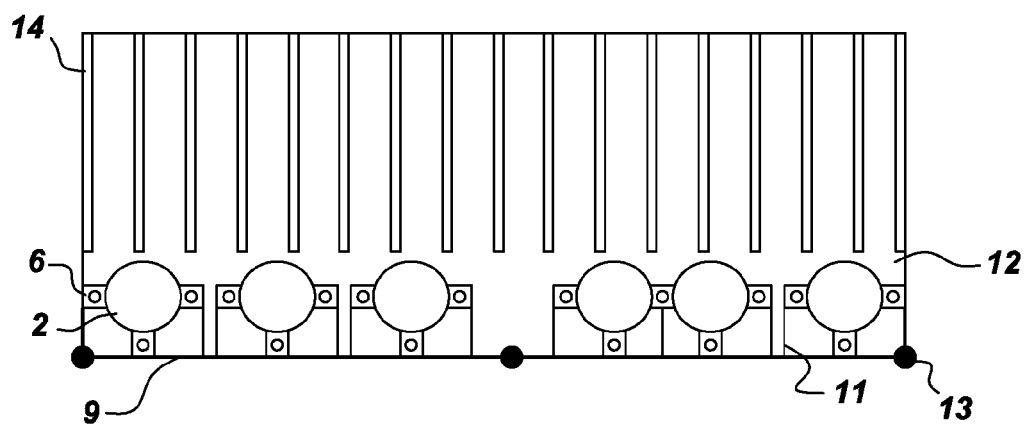
FIG. 8 illustrates a rod-and-frame arrangement for attaching the synthetic jets to the chassis.

FIG. 8 illustrates a rod-and-frame arrangement for attaching the synthetic jets to the chassis. For the arrangement shown in FIG. 8, each of the synthetic jet assemblies comprises a number of single orifice synthetic jets 2, and the attachment means comprise a frame 9 and a number of rods 11 attached to and extending from the frame 9. For the illustrated arrangement, each of the single orifice synthetic jets 2 is attached to two neighboring ones of the rods 11. According to a more particular arrangement, the attachment means further comprises a number of flexible portions 6, wherein each of the single orifice synthetic jets 2 has at least two flexible portions 6 affixed thereto, and wherein the single orifice synthetic jets 2 are attached to the rods 11 via the flexible portions 6. As noted above, one non-limiting example of the flexible portion 6 is a silicone "ear." For the specific arrangement shown in FIG. 8, each of the single orifice synthetic jets 2 has at least three flexible portions 6 affixed thereto. As shown, each of the single orifice synthetic jets 2 is attached directly to the frame 9 via a respective one of the flexible portions 6. In addition, the frame 9 may be affixed to the respective sidewall via rods/bolts 13, which are shown in top view in FIG. 8.

FIGS. 9(a)-(c), 10 (a) and (b) and 11 illustrate a partially enclosed packaging arrangement for mounting the synthetic jets on the chassis. For the arrangement shown in FIG. 11, each of the synthetic jet assemblies comprises a number of single orifice synthetic jets 2, and the attachment means comprise a partially enclosed package 20. Each of the single orifice synthetic jets 2 within a given synthetic jet assembly is disposed within the partially enclosed package 20.

Figure 9A:
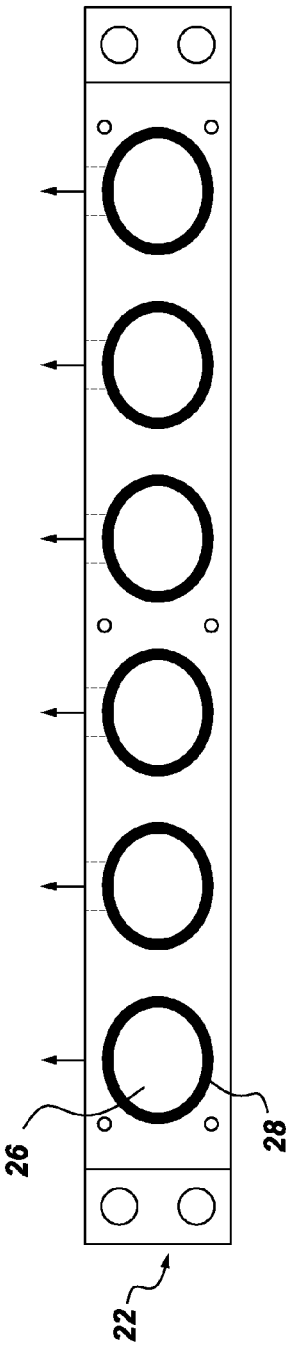
FIGS. 9(a)-(c) are top, front and back views of a first portion of a partially enclosed packaging arrangement for mounting the synthetic jets on the chassis.
Figure 9B:
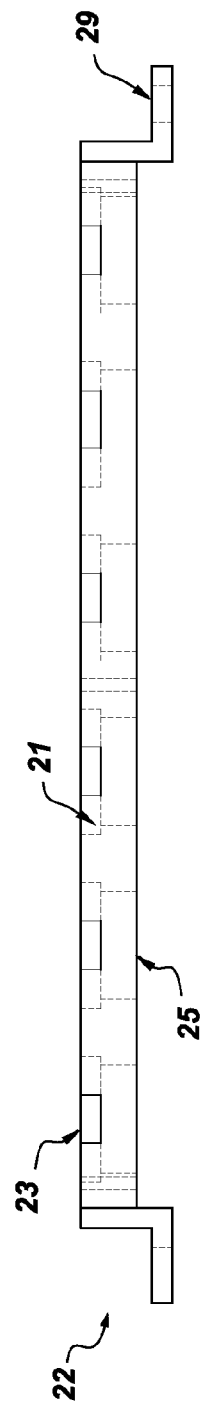
Figure 9C:
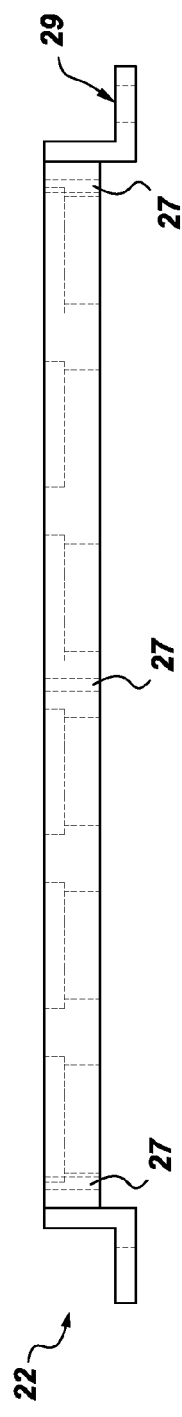
Figure 10A:
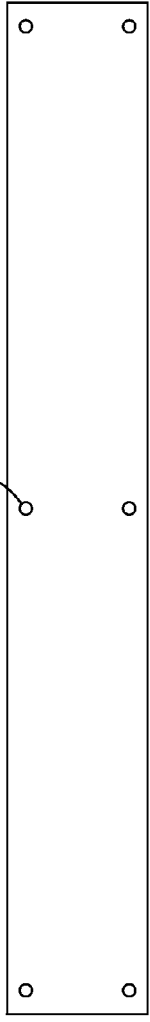
FIGS. 10(a) and (b) are a top view and a front/back view of a second portion of the partially enclosed packaging arrangement.
Figure 10B:
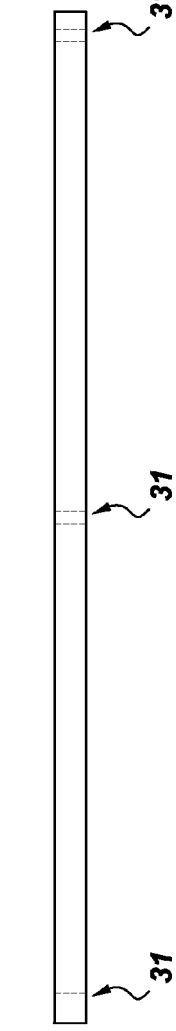
Figure 11:
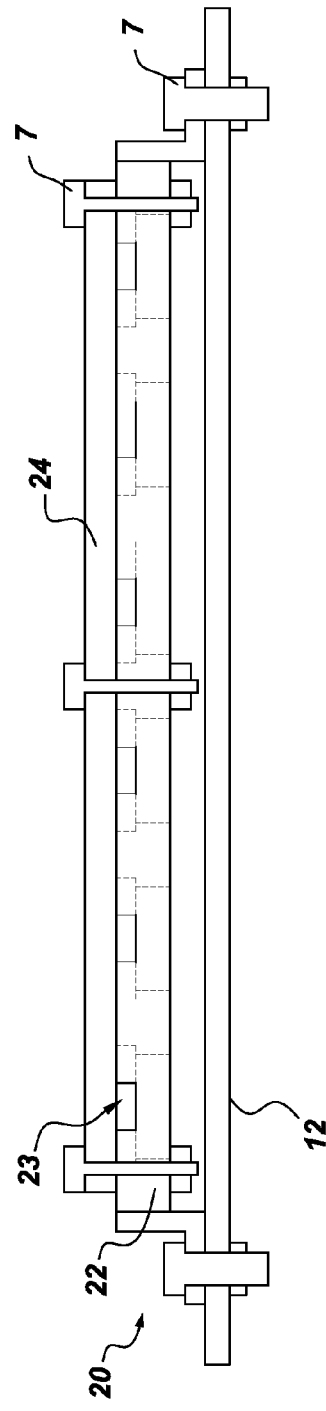
FIG. 11 is a front view of the assembled partially enclosed packaging arrangement.

For the example package configuration shown in FIGS. 9-11, the partially enclosed package 20 comprises a first portion 22 and a second portion 24. FIG. 9(a) is a top view of the first portion 22 of the package. Front and back views of the first portion 22 are shown in FIGS. 9(b) and 9(c), respectively. FIG. 10(a) is a top view of the second portion 24 of the package 20, and a front/back view of the second portion 24 is shown in FIG. 10(b). As shown for example in FIG. 9(a), the first portion 22 defines a number of openings 26 configured to receive respective ones of the single orifice synthetic jets (not shown). As shown for example in FIG. 11, after assembly, the second portion 24 is attached to the first portion 22 to cover the openings 26. For the example configuration shown in FIGS. 9-11, the second portion 24 is affixed to the first portion 22 by bolts 7.

As indicated in FIG. 9(a), for example, the illustrated partially enclosed package 20 further includes a number of gaskets 28. As shown, each of the gaskets 28 is disposed in a respective one of the openings 26 and accommodates a respective one of the single orifice synthetic jets 2. In one non-limiting example, the gaskets 28 are formed of silicone rubber. Beneficially, the gaskets shield the single orifice synthetic jets 2 from vibrations.

More particularly, and as shown in FIG. 9(b), the first portion 22 is recessed to provide recessed areas 21 for receiving respective ones of the jets and gaskets. In addition and as also shown in FIG. 9(b), openings 23 are provided for jet air, and holes 25 are provided within the first portion 22 for jet bellowing. The gaskets 28 position the jets in relation to the holes 25 and second portion 24 to obtain the needed volume for jet bellowing. For the example configuration shown in FIGS. 9(a)-(c), holes 27 are provided in the first portion 22 for bolting the first and the second portions 22, 24 together to form the package 20, as indicated in FIG. 9(c). In addition, holes 29 are formed in the ends of the first portion for bolting the package to the respective chassis sidewall 12, for the example arrangement shown in FIG. 9(c). Similarly, and as indicated in FIGS. 10 (a) and (b), holes 31 are formed in the second portion 24 for receiving the bolts 7. As shown for example in FIG. 11, the partially enclosed package 20 may be attached to a respective one of the sidewalls 12, for example with bolts 7. In addition, a vibration damper (or shock absorbing spacers, not shown) may be disposed between the package 20 and the respective chassis sidewall 12.

The invention embraces a number of modifications to the partially enclosed package. For example, replace the "L" shaped foot brackets in the example configuration of FIG. 11 may be replaced with a spacer or bushing made of a soft rubber (or Si) for shock absorption. Another option is to remove the L shaped bracket completely and extend the bolts used to attach the first and second portions through to the chassis sidewall to attach the package to the chassis sidewall.

In addition, an open version of the package 20 may be employed for weight reduction. For this arrangement, only enough material is used to form the first and second portions 22, 24 of the package to hold together structurally. This open version can be structured as a triangular lattice shape with six "ring" holders for the jets.

In addition, a variety of electrical connections (not shown) may be employed for powering the synthetic jets. The invention is not limited to any specific electrical connection configuration. In one example arrangement, a groove (not shown) is cast in the second portion 24 to accept wires from jets and route them to a connection outside the chassis. In another example arrangement, a groove is cast in the second portion 24 for routing wires together. While still in the package, the wires are routed down towards the chassis, for example, through alignment holes in the chassis and bottom part of the package. In this case, the drive electronics (not shown) would be internal to the chassis.

In yet another example arrangement for the electrical connections for the synthetic jets, the jets are equipped with a relatively small, secure set of leads, which terminate in a robust terminal pad (not shown). For this arrangement, the first portion 22 of the package 20 includes an area adjacent to the jet cut-out area with a cut-out (or recession) for the terminal pad. The second portion 24 of the package 20 includes matching pads and embedded wires (and for particular embodiments, printed circuit board type connections) to the terminal pad to the drive electronics. For this configuration, the drive electronics (not shown) are external to the chassis. However, this arrangement may be modified for use with drive electronics internal to the chassis. In this case, the wiring is on the first portion 22 of the package 20, to facilitate routing the wires into the chassis.

Figure 12:
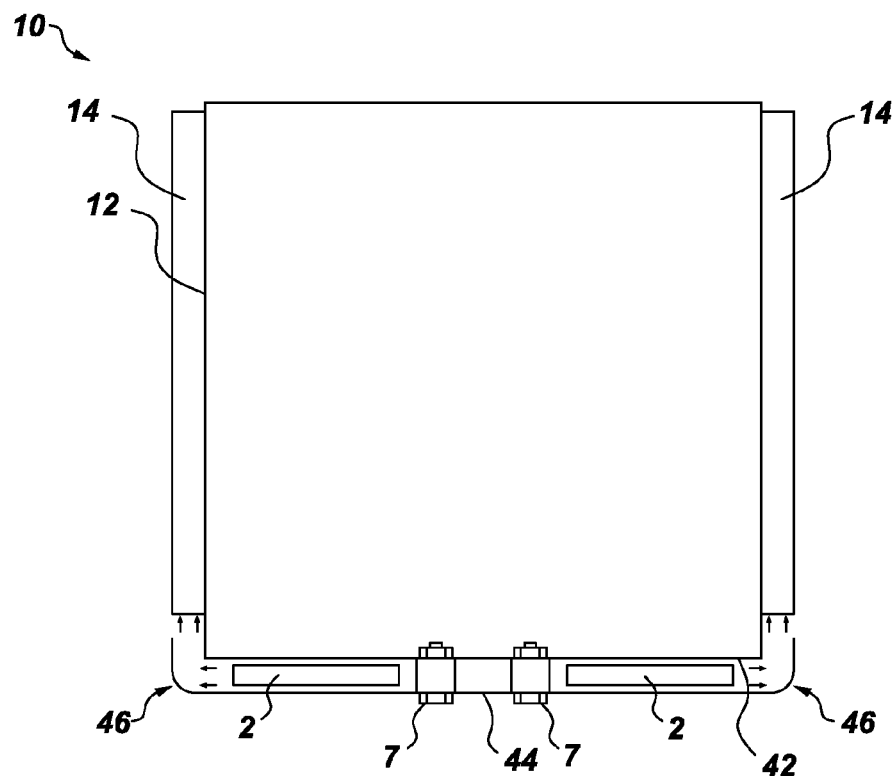
FIG. 12 illustrates a synthetic jet package with diverted airflow that incorporates a symmetric plate.
Figure 13:
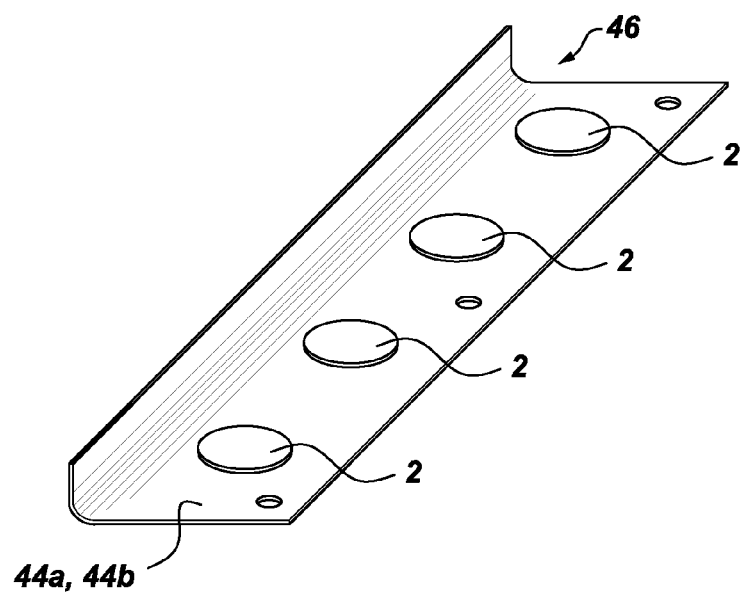
FIG. 13 illustrates a two-plate configuration of the synthetic jet package shown in FIG. 12.

FIGS. 12 and 13 illustrate another configuration for attaching the synthetic jets 2 to the chassis sidewalls, in which the airflow is diverted. For the arrangement shown in FIG. 12, a lower 42 one of the sidewalls 12 does not have an array of fins, and the attachment means comprises at least one plate 44 mounted to the lower sidewall 42. As indicated in FIG. 12, at least one of the single orifice synthetic jets 2 is mounted to the plate 44 and oriented to direct a jet outwards, and the plate 44 has at least one bent portion 46 for guiding the jet around a corner of the chassis for incidence upon the array of fins 14 on a neighboring one of the sidewalls 12.

For the particular arrangement shown in FIG. 12, the attachment means comprises one plate 44 mounted to the lower sidewall 42. For the arrangement shown in FIG. 12, the plate 44 is attached to the lower sidewall 42 with bolts 7. At least two of the single orifice synthetic jets 2 are mounted to the plate 44 and oriented to direct respective jets outwards in opposite directions, as indicated in FIG. 12. For the specific arrangement shown in FIG. 12, the plate 44 has two bent portions 46 for guiding respective ones of the jets around the respective corner of the chassis for incidence upon the array of fins 14 on respective neighboring ones of the sidewalls 12. According to a particular arrangement, a number of the single orifice synthetic jets 2 may be mounted to the plate 44 and oriented to direct respective jets outwards in a first direction, and a number of the single orifice synthetic jets 2 may be mounted to the plate 44 and oriented to direct respective jets outwards in a second direction. Although not expressly shown in FIG. 12, this is similar to the arrangement shown in FIG. 13 but with rows of jets 2 on either end of a symmetric plate 44.

Although FIG. 12 shows a single symmetric plate 44, this concept may also be implemented with two plates 44a,b, as indicated in FIG. 13. For the two-plate configuration, the attachment means comprises a first plate 44a and a second plate 44b mounted to the lower sidewall 42. The plates 44a,b may be bolted to the lower sidewall, similar to the arrangement shown in FIG. 12. As indicated in FIG. 13, at least one of the single orifice synthetic jets 2 is mounted to the first plate 44a. Similar to the arrangement shown in FIG. 12, the one or more jets are oriented to direct a jet outwards in a first direction. Similarly, at least one of the single orifice synthetic jets 2 is mounted to the second plate 44b and oriented to direct a jet outwards in a second direction. The relative orientation of the jets is the same as that shown in FIG. 12. Each of the first and second plates 44a,b has a bent portion 46 for guiding the respective jet around the respective corner of the chassis for incidence upon the array of fins 14 on the respective neighboring one of the sidewalls 12.

For the particular arrangement shown in FIG. 13, a number of the single orifice synthetic jets 2 are mounted to the first plate 44a and oriented to direct respective jets outwards in the first direction, and a number of the single orifice synthetic jets 2 are mounted to the second plate 44b and oriented to direct respective jets outwards in the second direction. The relative orientation of the jets is the same as that shown in FIG. 12. Beneficially, it is not necessary to remove portions of the fins 14 with the arrangements illustrated by FIGS. 12 and 13 because the jets 2 are mounted on the lower sidewall 42. In addition, the angle at which the bent portions are bent may be selected to adjust the angle between the air flow from the jets and the end surface of the fins 14. In addition the spacing between the plate(s) and the lower sidewall may be adjusted to adjust the relevant distance between the end surface of the fins and the vertical airflow.

Figure 14:
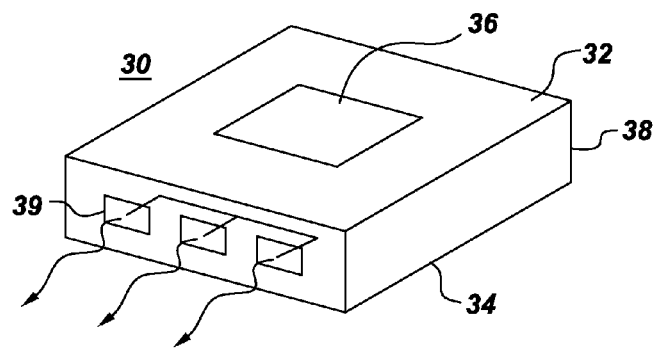
FIG. 14 depicts an example configuration for a multi-orifice synthetic jet for use in the chassis of FIG. 1.

As noted above, in addition to the single orifice synthetic jets 2, the synthetic jet assemblies may comprise multi-orifice synthetic jets 30, which are illustrated in FIG. 14. In addition, each synthetic jet assembly may comprise a stack (not shown) of the single or multi-orifice synthetic jets 30, as described in commonly assigned U.S. patent application Ser. No. 12/421,068, M. Arik et al., "Heat Sinks with Distributed and Integrated Jet Cooling," which is incorporated by reference herein in its entirety. As shown for example in FIG. 14, a multi-orifice synthetic jet 30 comprises a first flexible structure 32, a second flexible structure 34, at least one active material 36 coupled to at least one of the first and second flexible structures, and a compliant wall 38 positioned between the first and second flexible structures and defining a chamber. As indicated in FIG. 14, the compliant wall defines multiple orifices 39 for facilitating fluid communication between the chamber and an ambient environment of the fins 14. It should be noted that the number of orifices shown in FIG. 14 is merely illustrative and is non-limiting. In one non-limiting example, the compliant wall 38 comprises an elastomer. Other example materials for the compliant wall 38 include, without limitation, polymers, glues, adhesives, metals, and composites.

In the illustrated arrangement of FIG. 14, the active material 36 is positioned on both of the first and second flexible structures 32, 34. It should be noted that the locations of the active materials 36 on the flexible structures 32, 34 shown in the figures are purely illustrative, and the invention is not limited to any specific locations of active materials. In particular embodiments, the active material is coextensive with the respective flexible structure. In other embodiments, the active material extends over only a portion of the flexible structure. The active material can take the form of a single continuous portion. Alternatively, multiple discontinuous portions of the active material can be employed to actuate respective ones of the flexible structures. A suitable active material is one, which is capable of creating stress resulting from an electrical stimulus. Examples of suitable active material are provided above with reference to FIGS. 15 and 16.

As discussed above with reference to FIG. 2, a synthetic jet driver 40 may be provided to apply an electrical current to the at least one active material 36, to form streams of ambient air. The synthetic jet driver 40 may be located within the chassis or may be remotely located.

A number of different fin configurations can be employed in the above-described chassis. For the arrangements depicted in FIGS. 1 and 2, the fins are plate fins arranged in a regular one-dimensional array. FIG. 17 illustrates a v-groove plate fin configuration. Under specific circumstances, a v-groove configuration may exhibit enhanced cooling relative to a conventional plate fin arrangement shown for example in FIGS. 1 and 2. It should be noted that although FIG. 17 shows a v-groove configuration with symmetric v-grooves, the invention is not limited to these arrangements and can also employ asymmetric v-groove configurations. Similarly, although FIG. 17 shows v-grooves with centerlines aligned with the respective centerlines of the jets, offset arrangements may also be employed, in which the centerlines of the v-grooves are offset from the centerlines of the jets. Similarly, combinations of these arrangements may also be employed (asymmetric v-grooves that are offset for the respective jets).

Particular features of chassis 10 with distributed jet cooling are described with reference to FIGS. 15, 16, 18 and 19. As discussed above with reference to FIGS. 1 and 2, the chassis 10 includes one or more sidewalls 12 defining a volume (not shown) configured to substantially surround one or more heat generating components not shown) positioned within the volume. The chassis 10 further includes at least one array of fins 14 thermally coupled to a respective one of the one or more sidewalls and at least one synthetic jet assembly 30 comprising a number of single orifice synthetic jets 2 disposed on a side 15, 16 of a respective one of the at least one array of fins. As indicated, for example in FIG. 15, each of the single orifice synthetic jets 2 is configured to direct a jet at an end of a respective one of the fins 14 (an "on fin" configuration). Beneficially, experimental test results showed that on fin configurations (jet exit centerline is aligned with the respective fin) exhibited enhanced cooling performance relative to arrangements in which the jets were directed between neighboring fins.

Figure 20:
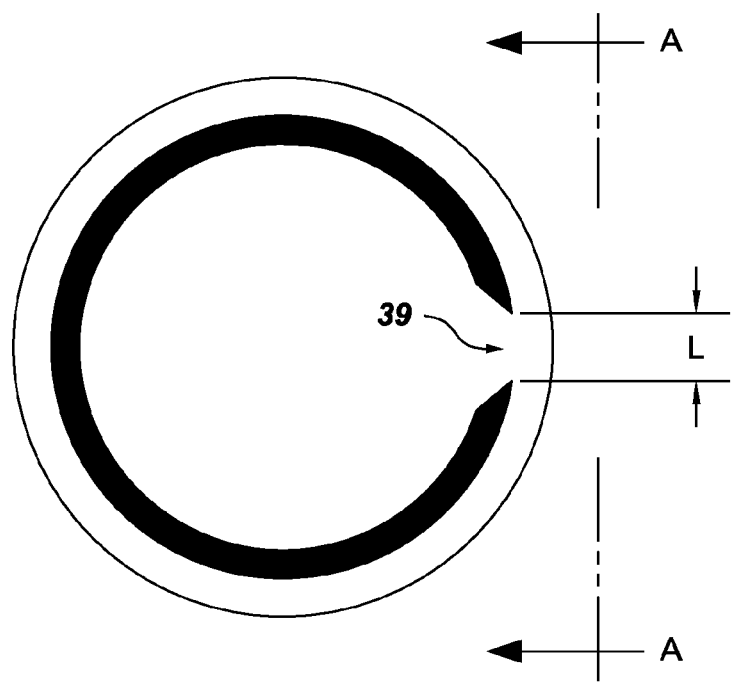
FIG. 20 shows an orifice for a jet with an opening length L.
Figure 21:
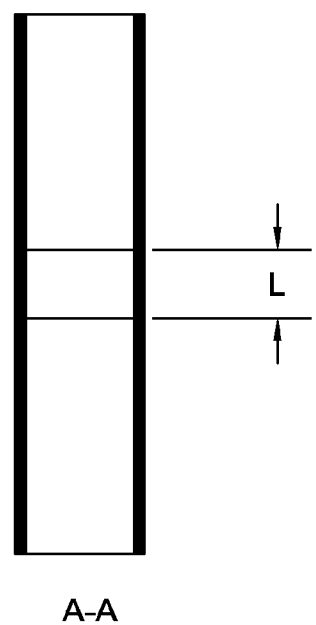
FIG. 21 is a cross section of FIG. 20 taken along AA.

As indicated, for example in FIGS. 15 and 16, each of the single orifice jets 2 comprises an orifice. For particular embodiments, at least a subset of the orifices have an opening length L in a range of about three (3) millimeters (mm) to about seventeen (17) mm, and the distance d (see, for example, FIG. 18) between a respective one of the orifices and the respective end of the fin is in a range of about one millimeter (mm) to about seven (7) mm. As shown for example, in FIGS. 20 and 21, the opening length L for the orifice 39 is the length of the chord formed by the ends of the walls (for example, silicon walls) that define the orifice. Thus, looking "head on" at the jet (facing the orifice), the opening length L is the 2-D length of the opening. More generally, the orifice size is selected to be proportional to the fin spacing to achieve optimal cooling, and to provide adequate cooling/vortex generation, the jets are optimally located with the fins. According to a more particular embodiment, at least a subset of the orifices have an opening length L in a range of about eight (8) mm to about seventeen (17) mm, and still more particularly, in a range of about thirteen (13) mm to about seventeen (17) mm. Experimental test results showed that 15 mm orifice jets exhibited enhanced cooling performance relative to 8 mm orifice jets.

According to a more particular embodiment, the distance d is in a range of about one millimeter (mm) to about 3 mm. In one non-limiting example the distance d between the orifice and the end of the fin is about two millimeters. As used here, the term "about" should be construed to mean within plus/minus ten percent of the stated value. Experimental test results showed similar cooling for jets spaced 10 mm and 2 mm from the respective fins. Hence, a two (2) mm spacing is preferred to reduce the space taken by jet mountings.

FIG. 19 shows three different "on fin" arrangements of synthetic jets and fins. 24. For the first configuration shown in FIG. 19 (labeled "3 jets"), each synthetic jet assembly comprises three single orifice synthetic jets 2, and the spacing between neighboring single orifice synthetic jets is every fourth fin. More generally, an integer number N of single orifice synthetic jets 2 may be used, where the spacing between neighboring single orifice synthetic jets is every fourth fin. For the first configuration shown in FIG. 19, N=3. For a chassis that is two times as wide as the tested heat sink, N=6, for example. As shown for example in FIG. 19, the phrase "every fourth fin" should be understood to mean every fourth fin for the case of a one-dimensional array of plate fins. Similarly, this refers to every fourth row of fins for the case of a two-dimensional array of pin fins.

For the second configuration shown in FIG. 19 (labeled "4 jets"), each synthetic jet assembly comprises four single orifice synthetic jets 2, and the spacing between neighboring single orifice synthetic jets 2 is every third fin. More generally, an integer number N of single orifice synthetic jets 2 may be used, where the spacing between neighboring single orifice synthetic jets is every third fin. For the second configuration shown in FIG. 19, N=4. For a chassis that is 150% as wide as the tested heat sink, N=6, for example. As shown for example in FIG. 19, the phrase "every third fin" should be understood to mean every third fin for the case of a one dimensional array of plate fins and every third row of fins for the case of a two dimensional array of pin fins.

For the third configuration shown in FIG. 19 (labeled "5 jets"), each synthetic jet assembly comprises five single orifice synthetic jets 2, and the spacing between neighboring single orifice synthetic jets 2 is every other fin. More generally, an integer number N of single orifice synthetic jets 2 may be used, where the spacing between neighboring single orifice synthetic jets is every other fin. For the second configuration shown in FIG. 19, N=5. However, the specific value of N may vary. As shown for example in FIG. 19, the phrase "every other fin" should be understood to mean every other fin for the case of plate fins and every other row of fins for the case of a two dimensional array of pin fins.

Although cooling enhancement increases with the number of jets, this trend decreases with increasing number of jets. Switching from three jets to four jets, the overall enhancement changes from 2.5 to 3.2, rising by 0.7, whereas it increases by 0.3 when switching from four jets to five jets. This indicates decrease of COP (coefficient of performance) as the number of jets increases. COP in the present work is defined as the ratio of heat dissipation to power consumption of synthetic jets. These results were obtained for a series of multiple jet tests for on-fin arrangements using synthetic jets with 15 mm orifices that were placed two mm below a finned plate. For these arrangements, switching from three jets to four jets caused COP to slightly decrease from 49 to 47. However, switching from four jets to five jets caused COP to decrease from 47 to 42. Beneficially, using four jets achieved 300% enhancement over natural convection with a coefficient of performance of 47.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A chassis with distributed jet cooling, the chassis comprising:
  a plurality of sidewalls defining a volume configured to substantially surround one or more heat generating components positioned within the volume, the plurality of sidewalls including:
    a first sidewall including an array of fins thermally coupled thereto; and
    a second sidewall adjacent to the first sidewall and oriented perpendicular to the first sidewall, the second sidewall comprising a lower sidewall free of fins;
  at least one plate mounted on the second sidewall, with each plate of the at least one plate including a first portion that is affixable to the second sidewall and one or more second portions formed integrally with the first portion and bent relative thereto so as to be oriented at an angle relative to the first portion; and
  a plurality of synthetic jets disposed on the first portion of the at least one plate;
  wherein the plurality of synthetic jets is oriented to direct jets of fluid out therefrom towards the one or more second portions of the at least one plate, with the one or more second portions guiding the jets of fluid towards the array of fins of the first sidewall.

2. The chassis of claim 1, wherein the plurality of synthetic jets comprises a plurality of single orifice synthetic jets.

3. The chassis of claim 1, further comprising a third sidewall including an array of fins thermally coupled thereto, the third sidewall being adjacent to the second sidewall and oriented perpendicular to the second sidewall;
  wherein a junction between the first sidewall and the second sidewall and a junction between the third sidewall and the second sidewall each forms a respective corner of the chassis.

4. The chassis of claim 3, wherein the at least one plate comprises a single plate mounted on the second sidewall, with the first portion of the single plate having a second portion on each of opposing ends thereof such that a second portion is positioned adjacent the junction between the first sidewall and the second sidewall and a second portion is positioned adjacent the junction between the third sidewall and the second sidewall.

5. The chassis of claim 3, wherein the at least one plate comprises:
  a first plate positioned adjacent the junction between the first sidewall and the second sidewall; and
  a second plate positioned adjacent the junction between the third sidewall and the second sidewall.

6. The chassis of claim 3, wherein the second portion of the at least one plate guides the jets of fluid around a respective corner of the chassis for incidence upon the array of fins on a respective one of the first sidewall and the third sidewall.

7. The chassis of claim 1, wherein the first portion comprises a flat portion that is substantially parallel to the second sidewall when affixed thereto and wherein each of the one or more second portions comprises a bent portion oriented at an angle relative to the flat portion.

8. The chassis of claim 7, each of the one or more bent portions is oriented at 90 degrees from the flat portion.

9. The chassis of claim 3, wherein the plurality of synthetic jets includes:
  a first number of synthetic jets oriented to direct jets of fluid out therefrom toward a second portion positioned adjacent the junction between the first sidewall and the second sidewall; and
  a second number of synthetic jets oriented to direct jets of fluid out therefrom toward a second portion positioned adjacent the junction between the third sidewall and the second sidewall;
  wherein the jets of fluid directed out from the first number of synthetic jets is opposite the jets of fluid directed out from the second number of synthetic jets.

10. The chassis of claim 1, wherein the at least one plate includes a plurality of holes formed therein configured to receive bolts therein for securing the at least one plate to the second sidewall.

11. The chassis of claim 1, wherein the plurality of synthetic jets are aligned parallel to the first portion of the at least one plate so as to extend along a length thereof.

12. The chassis of claim 1, wherein the one or more second portions of the at least one plate guide the jets of fluid towards the array of fins of the first sidewall in a generally vertical upward direction.

13. A chassis with distributed jet cooling, the chassis comprising:
  a plurality of walls defining a volume configured to substantially surround one or more heat generating components positioned within the volume, the plurality of walls including:
    a pair of sidewalls each including an array of fins thermally coupled thereto; and
    a lower wall positioned adjacent to and between the pair of sidewalls, the lower sidewall being free of fins;
  a plate mounted on the lower sidewall, the plate comprising:
    a flat section affixable to the lower wall; and
    a pair of bent sections that are oriented at an angle relative to the flat section, with a bent section being positioned at each of opposing ends of the flat section; and
  a plurality of synthetic jets disposed on the flat section of the plate and configured to direct jets of fluid out therefrom;
  with the pair of bent sections guiding the jets of fluid towards the array of fins on the pair of sidewalls.

14. The chassis of claim 13, wherein the plurality of synthetic jets comprises:
  a first number of synthetic jets oriented to direct jets of fluid out therefrom in a first outward direction; and
  a second number of synthetic jets oriented to direct jets of fluid out therefrom in a second outward direction opposite the first outward direction;
  with the pair of bent sections guiding the jets of fluid directed in the first outward direction towards the array of fins on one of the pair of sidewalls and guiding the jets of fluid directed in the second outward direction towards the array of fins on the other of the pair of sidewalls.

15. The chassis of claim 13, wherein the flat section of the plate includes a plurality of holes formed therein configured to receive bolts therein for securing the plate to the lower wall.

16. The chassis of claim 13, wherein the bent sections guide the jets of fluid around a corner of the chassis formed by the lower wall and a respective one of the pair of sidewalls for incidence upon the array of fins on the respective one of the pair of sidewalls.

17. The chassis of claim 13, wherein the plurality of synthetic jets are aligned parallel to the lower wall so as to extend along a length thereof.

18. A chassis with distributed jet cooling, the chassis comprising:
   a plurality of walls defining a volume configured to substantially surround one or more heat generating components positioned within the volume, the plurality of walls including:
      a pair of sidewalls each including an array of fins thermally coupled thereto; and
      a lower wall positioned adjacent to and between the pair of sidewalls, the lower sidewall being free of fins;
   a first plate and a second plate mounted on the lower sidewall on generally opposing ends thereof, each of the first and second plates comprising:
      a flat section affixable to the lower wall; and
      a bent section that is oriented at an angle relative to the flat section; and
   a plurality of synthetic jets disposed on the flat section of each of the first and second plates that direct jets of fluid out therefrom;
   wherein the bent section on each of the first and second plates guides jets of fluid from its respective plurality of synthetic jets towards the array of fins on the respective one or the pair of sidewalls.

19. The chassis of claim 18, wherein the plurality of synthetic jets disposed on the flat section of the first plate are oriented to direct jets of fluid out therefrom in a first outward direction and the plurality of synthetic jets disposed on the flat section of the second plate are oriented to direct jets of fluid out therefrom in a second outward direction opposite the first outward direction.

20. The chassis of claim 18, wherein the flat section of each of the first and second plates includes a plurality of holes formed therein configured to receive bolts therein for securing the respective plate to the lower wall.

* * * * *